United States Patent
Kimura

(10) Patent No.: US 6,847,668 B2
(45) Date of Patent: Jan. 25, 2005

(54) RIDGE-TYPE SEMICONDUCTOR LASER ELEMENT

(75) Inventor: Takashi Kimura, Kyoto (JP)

(73) Assignee: Rohm, Co., Ltd., Kyoto (JP)

( * ) Notice: Subject to any disclaimer, the term of this patent is extended or adjusted under 35 U.S.C. 154(b) by 0 days.

(21) Appl. No.: 10/216,239

(22) Filed: Aug. 12, 2002

(65) Prior Publication Data

US 2003/0031223 A1 Feb. 13, 2003

(30) Foreign Application Priority Data

Aug. 13, 2001 (JP) ........................................ 2001-245642

(51) Int. Cl.[7] ............................................... H01S 5/00
(52) U.S. Cl. ............................................. 372/45; 372/46
(58) Field of Search ..................................... 372/45–46

(56) References Cited

U.S. PATENT DOCUMENTS

| | | | | |
|---|---|---|---|---|
| 4,682,337 A | * | 7/1987 | Amann | ........................ 372/45 |
| 4,932,033 A | * | 6/1990 | Miyazawa et al. | ............ 372/46 |
| 5,887,011 A | * | 3/1999 | Ohkura et al. | ................. 372/46 |
| 5,940,423 A | * | 8/1999 | Sahara | ........................ 372/46 |

* cited by examiner

Primary Examiner—Minsun Oh Harvey
Assistant Examiner—James Menefee
(74) Attorney, Agent, or Firm—Rabin & Berdo, P.C.

(57) ABSTRACT

The present invention provides a ridge-type semiconductor laser devise comprising: a lower cladding layer of a first conductivity type, an active layer, and a first upper cladding layer of a second conductivity type, which are sequentially stacked on a compound semiconductor substrate of the first conductivity type; a second upper cladding layer of the second conductivity type which has a ridge shape and is provided on the first upper cladding layer; and a contact layer of the second conductivity type provided on the second upper cladding layer. Current blocking layers are provided on the first upper cladding layer, alongside the second upper cladding layer. Respective sections of these current blocking layers that follow the sides of the second upper cladding layer are of the second conductivity type, and respective sections of these current blocking layers that follow the first upper cladding layer are of the first conductivity type.

7 Claims, 3 Drawing Sheets

RIDGE-TYPE SEMICONDUCTOR LASER ELEMENT

BACKGROUND OF THE INVENTION

1 Field of the Invention

The present invention relates to a ridge-type semiconductor laser devise to be used in an optical disk device such as a CD-R/RW drive or DVD-RAM drive, and to a fabrication method thereof.

2 Description of the Related Art

Attempts have been made to increase the recording speed of optical recording devices. For example, CD-R drives having a so-called "16 speed" recording speed are already being put to practical use. Accordingly, in optical recording devices with a high recording speed, an instantaneous start up of high output laser light is required. There are ridge-type semiconductor laser devises that use compound semiconductors, these being laser devises that satisfy such a required characteristic.

FIG. 3 is a schematic cross-sectional view of the structure of a conventional ridge-type semiconductor laser devise, showing a cross section that lies orthogonal to the longitudinal direction of the devise.

A lower cladding layer 32, an active layer 33, and a first upper cladding layer 34 are sequentially stacked on a substrate 31. A ridge-shaped second upper cladding layer 37 is formed on the first upper cladding layer 34 in a position substantially central in the width direction of the devise, so as to extend in the longitudinal direction of the devise. Current blocking layers 36 are formed on both sides of the second upper cladding layer 37. A contact layer 38, which makes ohmic contact with the second upper cladding layer 37, is formed on the second upper cladding layer 37 and the current blocking layers 36.

An n-side electrode and a p-side electrode (not illustrated) are formed on the lower face of the substrate 31 and the upper face of the contact layer 38 respectively.

The conductivity type of each portion is as follows. For example, the substrate 31, lower cladding layer 32 and current blocking layers 36 are n-type layers, and the first upper cladding layer 34, second upper cladding layer 37, and contact layer 38 are p-type layers. The active layer 33 can also be an n-type layer or a p-type layer, or can be an undoped layer.

During laser light emission, light emission takes place upon recombination of electrons and holes in the active layer 33.

In the section above the active layer 33, because the conductivity type of the current blocking layers 36 alone differs from that of the other sections, current is confined between the current blocking layers 36. The injection of current from the second upper cladding layer 37 to the active layer 33 takes place via the bottom face of the second upper cladding layer 37. Accordingly, within the active layer 33, light emission occurs upon recombination of electrons and holes (carriers) in a region E3 (referred to as "light emitting region E3" hereinbelow) whose width is substantially equal to the width S3 of the bottom face of the second upper cladding layer 37 (referred to as "injection current width S3" hereinbelow). Here, carriers are not consumed uniformly within the light emitting region E3, there being greater consumption of carriers in the vicinity of the width direction center portion.

Therefore, even though carrier consumption is non-uniform, the diffusion of carriers (particularly a small number of carriers) results in the carrier concentration being to some extent uniform within the light emitting region E3. However, when the operating current is high and the injection current width S3 is wide, diffusion is unable to replenish carriers and the light intensity distribution is then accordingly non-uniform. In other words, the section within the light emitting region E3 which exhibits high intensity light emission moves over to the section in which the carrier concentration is high, which accordingly makes the light output unstable. A laser whose light output is unstable cannot be used in optical recording or optical reading applications. Thus, the maximum rated light output of a laser devise is established within a range in which the light output is not unstable.

Non-uniformity of the carrier concentration can be eliminated by narrowing the injection current width S3. That is, as a result of making the injection current width S3 equal to or less than the carrier diffusion distance (carrier diffusion length) in the active layer 33, a small number of carriers can be reliably replenished in the section where a large number of carriers are consumed, whereby it is possible to realize uniform light emission within the light emitting region E3. That is, by means of such a structure, the light output region within which a stable light output can be obtained can be made large, which makes it possible to raise the maximum rated light output of the laser devise.

Further, when the injection current width S3 is narrowed, the upper face width D3 of the second upper cladding layer 37 also narrows. This is because the inclined planes of the second upper cladding layer 37 are formed at fixed angles of inclination, meaning that when the thickness of the second upper cladding layer 37 is fixed, the injection current width S3 and the upper face width D3 cannot be changed independently of one another. Because the current flows through the interface between the contact layer 38 and the second upper cladding layer 37, a narrowing of the upper face width D3 causes shrinkage of the surface area of the interface between the contact layer 38 and the second upper cladding layer 37, which in turn raises the resistive value of the devise.

SUMMARY OF THE INVENTION

It is an object of the present invention to provide a ridge-type semiconductor laser devise that permits an increase in the maximum rated light output.

It is another object of the present invention to provide a ridge-type semiconductor laser devise that permits a reduction of the resistance of the devise.

It is yet another object of the present invention to provide a fabrication method for the ridge-type semiconductor laser devise that permits an increase in the maximum rated light output.

It is yet another object of the present invention to provide a fabrication method for the ridge-type semiconductor laser devise that permits a reduction of the resistance of the devise.

The ridge-type semiconductor laser devise of the present invention comprises: a lower cladding layer of a first conductivity type, an active layer, and a first upper cladding layer of a second conductivity type, which are sequentially stacked on a compound semiconductor substrate of the first conductivity type; a second upper cladding layer of the second conductivity type which has a ridge shape and is provided on the first upper cladding layer; a contact layer of the second conductivity type provided on the second upper cladding layer; and current blocking layers, which are provided alongside the second upper cladding layer and in which respective sections that follow the sides of the second upper cladding layer are of the second conductivity type, and respective sections that follow the first upper cladding layer are of the first conductivity type.

According to the present invention, the second upper cladding layer, the respective sections of the current blocking layers which follow the sides of the second upper cladding layer (referred to as "inclined sections" hereinbelow), and the contact layer are of the same conductivity type. Thus, current flows not only through the interface between the second upper cladding layer and the contact layer, but can also flow between the second upper cladding layer and the contact layer by passing through the inclined sections. On the other hand, because the respective sections of the current blocking layers which follow the first upper cladding layer (referred to as "horizontal sections hereinbelow) are of a different conductivity type to that of the second upper cladding layer, it is possible to cause current to be confined to within a predetermined width and to make the light emitting region a predetermined width.

Therefore, even when the width of the lower face of the second upper cladding layer (injection current width) is narrower than normally and, accordingly, the upper face of the second upper cladding layer then narrows, the current can flow so as to pass through a large surface area, meaning that the resistance of the devise is then low.

Therefore, without provoking an undesirable increase in the devise resistance, the injection current width is made equal to or less than the carrier diffusion length, whereby the carrier concentration in the active layer can be kept uniform. Thus, because a stable light output can be obtained up to a high level, the maximum rated light output of the ridge-type semiconductor laser devise can be raised. For example, when the carrier diffusion length is 4 μm, the injection current width can, for example, be set at 3 to 4 μm.

A ridge-type semiconductor laser devise of this kind can be fabricated by means of a method comprising the steps of: sequentially stacking a lower cladding layer, an active layer and a first upper cladding layer on a compound semiconductor substrate; forming a ridge-shaped second upper cladding layer on the first upper cladding layer; using a Group III element feedstock that contains Group III element compounds with a methyl group (preferably at a temperature of 550° C. to 650° C.) to selectively grow current blocking layers alongside the ridge-shaped second upper cladding layer; and forming a contact layer on the second upper cladding layer.

Growth of the current blocking layers can be performed by means of the MOCVD (Metal-Organic Chemical Vapor Deposition) method. When the current blocking layers consist of an AlGaAs-based material, trimethyl gallium, trimethyl aluminum, and the like, can be suitably employed as Group III element compounds with a methyl group.

When the above-mentioned first conductivity type is n-type and the above-mentioned other conductivity type is p-type, doping can be carried out with silicon (Si), for example, as the impurity for n-type formation, in the formation of the current blocking layers. Silicon is introduced readily into the respective sections in the current blocking layers which are grown along the plane whose surface index is (100), but it is difficult to introduce silicon into the respective sections which are grown along the plane whose surface index is (111A). Therefore, when the main surface index of the sides of the second upper cladding layer is (111A), it is difficult to introduce silicon into the respective inclined sections of the current blocking layers. Also, when the main surface index of the upper face of the second upper cladding base layer is (100), silicon is readily introduced into the respective horizontal sections of the current blocking layers.

Further, at a temperature of 550° C. to 650° C., carbon (C), which is contained in feedstock constituted by organic compounds (for example trimethyl gallium, trimethyl aluminum, and the like), readily remains in the film. The carbon functions as an impurity for p-type formation in the current blocking layers.

As a result of the relationship between the amounts of carbon and silicon, deposition performed in a temperature range of 550° C. to 650° C. causes the p-type carrier concentration to be higher than the n-type carrier concentration in the inclined sections, and the n-type carrier concentration to be higher than the p-type carrier concentration in the horizontal sections. Thus, the inclined sections are p-type and the horizontal sections are n-type. When the temperature in the formation of the current blocking layers is equal to or less than 550° C., the film quality of the current blocking layers deteriorates, and when this temperature is equal to or more than 650° C., current blocking layers having the conductivity types described above cannot be obtained.

The above-described objects, characteristics and effects of the present invention or further objects, characteristics and effects thereof will be clarified in the following description of the embodiments, with reference to the attached drawings.

DESCRIPTION OF THE PREFERRED EMBODIMENTS

Figure 1:
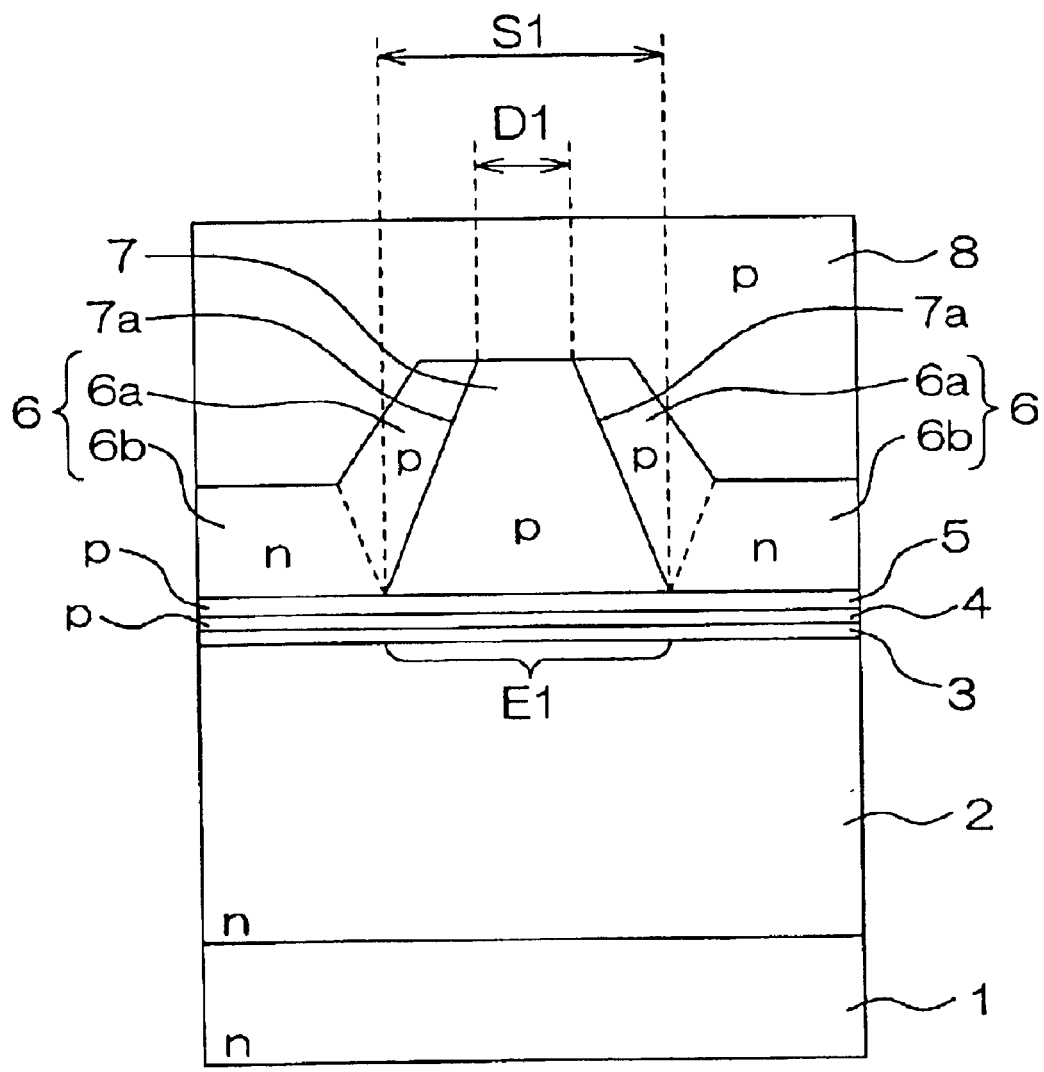
FIG. 1 is a schematic cross-sectional view of the structure of the ridge-type semiconductor laser devise according to an embodiment of the present invention.

FIG. 1 is a schematic cross-sectional view of the structure of the ridge-type semiconductor laser devise according to an embodiment of the present invention, showing a cross section that lies orthogonal to the longitudinal direction of the devise.

A lower cladding layer 2, an active layer 3, a first upper cladding layer 4, and an etching stop layer 5 are sequentially stacked on a substrate 1. A ridge-shaped second upper cladding layer 7 is formed on the etching stop layer 5 in a position substantially central in the width direction of the devise, so as to extend in the longitudinal direction of the devise (perpendicular to the page of FIG. 1). The width S1 of the bottom face of the second upper cladding layer 7 (referred to as injection current width S1 hereinbelow) is shorter than the carrier diffusion length. When the carrier diffusion length is 3 μm, the injection current width S1 can be made, for example, 2 to 3 μm. In other words, the injection current width S1 is narrow in comparison with a conventional injection current width (injection current width S3 in FIG. 3).

The thickness of the second upper cladding layer 7 and the angle of inclination of the sides 7a of the second upper cladding layer 7 are of the same magnitude as those adopted conventionally. Thus, the upper face width D1 of the second upper cladding layer is narrower than that adopted conventionally (upper face width D3 in FIG. 3).

A current blocking layer 6 is formed on both sides of the second upper cladding layer 7. The current blocking layers 6 are formed so as to follow the sides 7a of the second upper cladding layer 7 and the upper face of the etching stop layer 5. A contact layer 8, which makes ohmic contact with the second upper cladding layer 7, is formed on the second upper cladding layer 7 and the current blocking layers 6.

Substrate 1 consists of an n-type GaAs compound semiconductor and the lower cladding layer 2 consists of n-type $Al_{x1}Ga_{(1-x1)}As$. The active layer 3 is of the n-type or p-type conductivity type, or is undoped, and can also consist of a single layer of $Al_{y1}Ga_{(1-y1)}As$ or can consist of layers of two types having different compositions. In other words, an MQW (Multi Quantum Well) active layer in which an $Al_{y11}Ga_{(1-y11)}As$ layer and an $Al_{y12}Ga_{(1-y12)}As$ (y11≠y12) layer are alternately stacked is also possible, or an MQW active layer in which an $Al_{y1}Ga_{(1-y1)}As$ layer and a GaAs layer are alternately stacked, is also possible.

The first upper cladding layer 4 consists of p-type $Al_{x2}Ga_{(1-x2)}As$. The etching stop layer 5 is formed from a p-type $In_{(1-z)}Ga_zP$ layer and can be made resistant to the etching medium.

The second upper cladding layer 7 consists of p-type $Al_{x3}Ga_{(1-x3)}As$. The current blocking layers 6 consist of $Al_{y2}Ga_{(1-y2)}As$ or GaAs. With regard to the conductivity type of the current blocking layers 6, the respective sections thereof that follow the sides 7a of the second upper cladding layer 7 (referred to as "inclined sections 6a" hereinbelow) are p-type sections, and the respective sections thereof that follow the etching stop layer 5 (referred to as "horizontal sections 6b" hereinbelow) are n-type sections. The contact layer 7 consists of p-type GaAs.

An n-side electrode and a p-side electrode (not illustrated) are formed on the lower face of the substrate 1 and the upper face of the contact layer 8 respectively.

During laser light emission, light emission takes place upon recombination of electrons and holes in the active layer 3.

Injection of current from the second upper cladding layer 7 to the active layer 3 takes place via the lower face of the second upper cladding layer 7 and, consequently, the active layer 3 emits light in a region E1 that has substantially the same width as the injection current width S1 (referred to as light emitting region E1 hereinbelow). Carriers are not consumed uniformly within the light emitting region E1, there being greater consumption of carriers in the vicinity of the width direction center portion. However, because the injection current width S1 is equal to or less than the carrier diffusion distance, even if the operating current is high, carriers (particularly a small number of carriers) are reliably replenished in the section where a large number of carriers is consumed, whereby it is possible to realize uniform light emission within the light emitting region E1. That is, by means of such a structure, since the light output can be stabilized, the stable operating region is enlarged, which makes it possible to raise the maximum rated light output of the laser devise.

Figure 3:
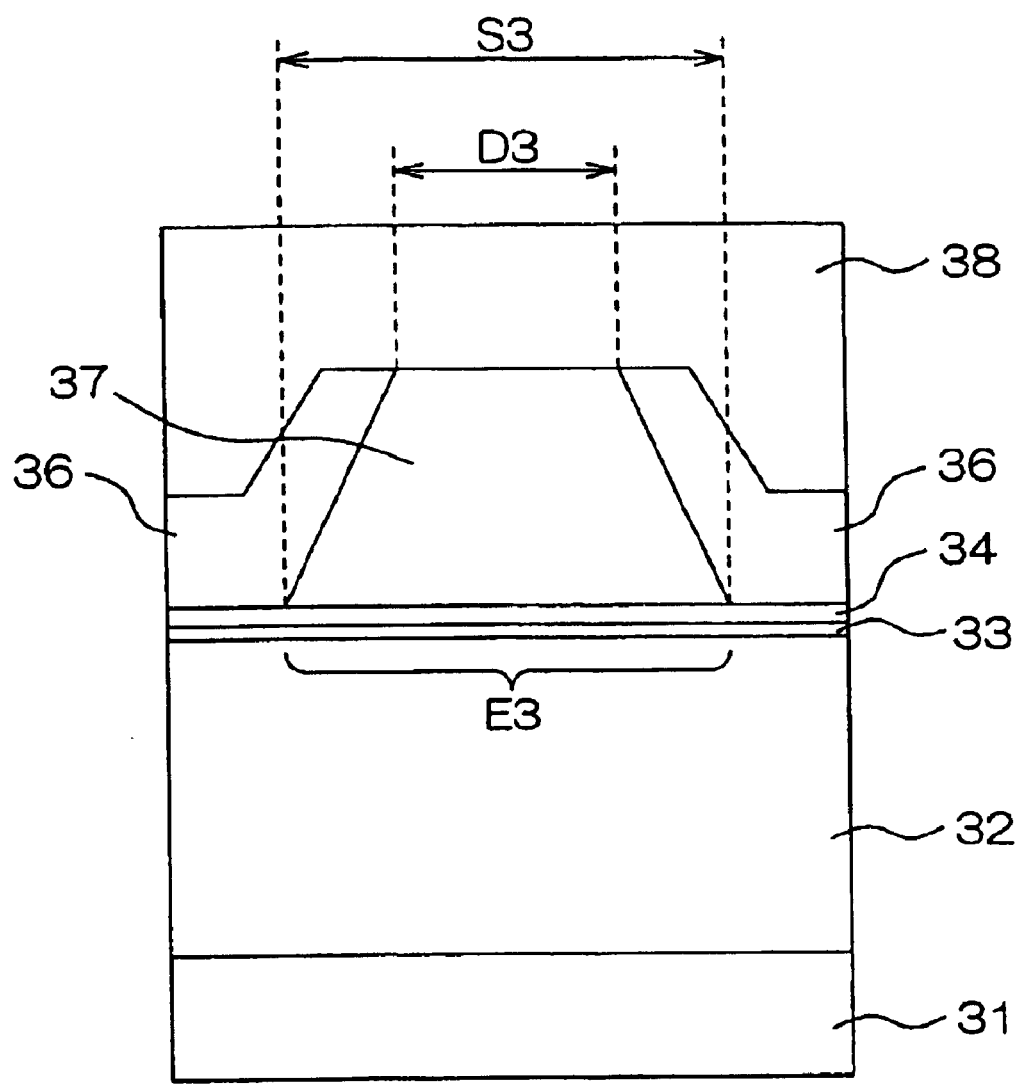
FIG. 3 is a schematic cross-sectional view of the structure of a conventional ridge-type semiconductor laser devise.

The upper face width D1 of the second upper cladding layer 7 is narrower than the width adopted conventionally (upper face width D3 in FIG. 3). However, because the conductivity type of the inclined sections 6a is p-type, which is the same as the conductivity type of the second upper cladding layer 7 and of the contact layer 8, current flows not only through the interface between the second upper cladding layer 7 and the contact layer 8, but can also flow between the second upper cladding layer 7 and the contact layer 8 by passing through the inclined sections 6a. The resistance of this ridge-type semiconductor laser devise is therefore low.

Furthermore, the conductivity type of the horizontal sections 6b is n-type, which is different from the conductivity type of the second upper cladding layer 7 and of the contact layer 8. The horizontal sections 6b therefore permit current to be confined to the injection current width S1, which makes it possible to cause light emission in a predetermined region of the active layer 3 (light emitting region E1).

FIGS. 2(a) to 2(e) are schematic cross-sectional views in which the fabrication method of the ridge-type semiconductor laser devise in FIG. 1 is shown sequentially in steps.

Figure 2:
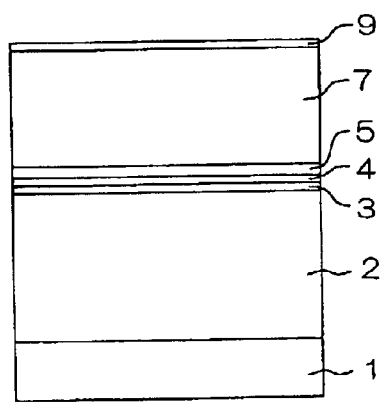
FIGS. 2(a) to 2(e) are schematic cross-sectional views in which the fabrication method of the ridge-type semiconductor laser devise in FIG. 1 is shown sequentially in steps.
Figure 2:
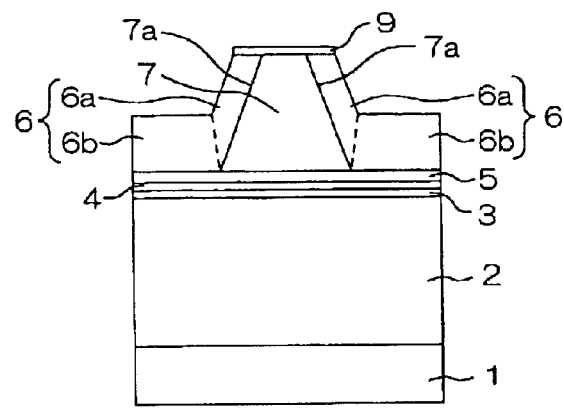
Figure 2:
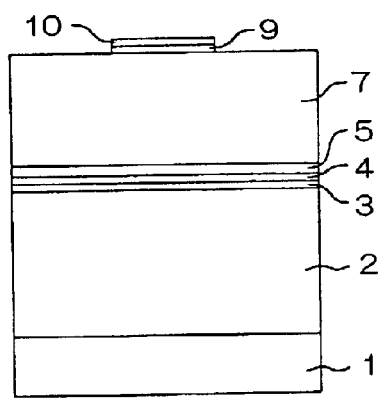
Figure 2:
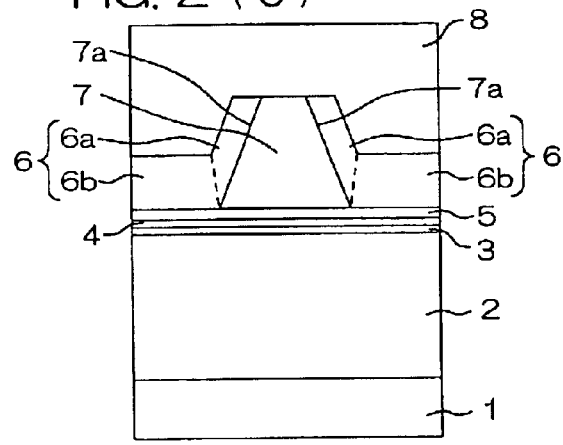
Figure 2:
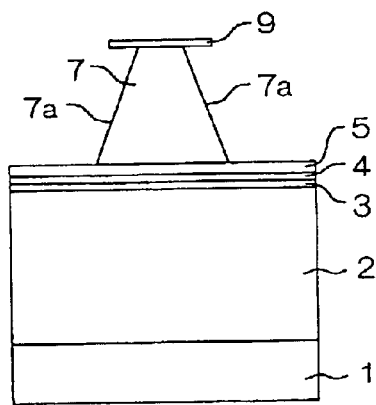

A lower cladding layer 2, an active layer 3, a first upper cladding layer 4, an etching stop layer 5 and a second upper cladding layer 7 are sequentially formed on the upper face of the substrate 1 whose surface index is (100) (FIG. 2(a)). Here, the upper face surface index of the lower cladding layer 2, active layer 3, first upper cladding layer 4, etching stop layer 5 and second upper cladding layer 7 respectively is the same as the surface index of the upper face of substrate 1, namely (100).

The formation (deposition) of these layers can be carried out by means of the MOCVD (Metal Organic Chemical Vapor Deposition) method.

Thereafter, the substrate 1 is transferred to a specially prepared sputtering apparatus, and a mask layer 9 consisting of $SiO_2$ or SiN is then formed on the surface of this substrate (FIG. 2(a)).

Next, a resist 10 is formed on the mask layer 9 in accordance with a photoresist method, and the mask layer 9 is then etched away in stripes (FIG. 2(b)). Then the resist 10 is removed and the second upper cladding layer 7 is subjected to wet etching or dry etching to afford same a ridge shape. Because the etching stop layer 5 is resistant to the etching medium, there is no etching of the layers below the etching stop layer 5 (FIG. 2(c)). The main surface index of the upper face of the etching stop layer 5 which is produced by this etching is (100), and the main surface index of the sides 7a of the second upper cladding layer 7 which is produced by this etching is (111A).

The resulting semi-processed product is returned once again to the thin film forming apparatus in accordance with the MOCVD method and, at a deposition temperature of 550° C. to 650° C., a current blocking layer 6 is formed on both sides of the second upper cladding layer 7. Here, by using a Group III element feedstock that contains Group III element compounds with a methyl group, a current blocking layer 6 containing Group III elements can be selectively formed on both sides of the second upper cladding layer 7. In other words, the current blocking layers 6 are formed along the sides 7a of the second upper cladding layer 7 and along the upper face of the etching stop layer 5 without being formed on the mask layer 9 (FIG. 2(d)). Trimethyl gallium, trimethyl aluminum, and the like, can be suitably employed as Group III element compounds with a methyl group.

In the formation of the current blocking layers 6, doping can be carried out with silicon (Si), for example, as the impurity for n-type formation. Monosilane, for example, can be used for the silicon feedstock. Here, it is difficult to introduce silicon into the inclined sections 6a in the current blocking layers 6 which are respectively grown on the sides 7a whose main surface index is (111A). On the other hand, silicon is readily introduced into the horizontal sections 6b in the current blocking layers 6 which are grown on the upper face of the etching stop layer 5 whose main surface index is (100).

Further, at a temperature of 550° C. to 650° C., carbon (C), which is contained in feedstock constituted by organic compounds (for example trimethyl gallium, trimethyl aluminum, and the like), readily remains in the film. The carbon functions as an impurity for p-type formation in the current blocking layers 6.

As a result of the relationship between the amounts of carbon and silicon, deposition performed in a temperature range of 550° C. to 650° C. causes the p-type carrier concentration to be higher than the n-type carrier concentration in the inclined sections 6a, and the n-type carrier concentration to be higher than the p-type carrier concentration in the horizontal sections 6b. Thus, the inclined sections 6a are p-type and the horizontal sections 6b are n-type. When the temperature in the formation of the current blocking layers 6 is equal to or less than 550° C., the film quality of the current blocking layers 6 deteriorates, and when this temperature is equal to or more than 650° C., current blocking layers 6 having the conductivity types described above cannot be obtained.

Thereafter, the mask layer 9 is removed by etching, and a contact layer 8 is formed on the second upper cladding layer 7 and on the current blocking layers 6 (FIG. 2(e)).

The ridge-type semiconductor laser devise described above is an example based on AlGaAs, but could also be based on InGaAlP.

Embodiments of the present invention have been described in detail hereinabove but these embodiments are merely specific examples used in order to clarify the technological purport of the present invention. The present invention should not be interpreted as being limited to or by these specific examples, the spirit and scope of the present invention being limited only by the scope of the attached claims.

This application claims benefit of Japanese Patent Application No. 2001-245642 filed in Japan on Aug. 13, 2001 the contents of which are incorporated by this reference.

What is claimed is:

1. A ridge-type semiconductor laser devise, comprising:
   a lower cladding layer of a first conductivity type formed on a compound semiconductor substrate of said first conductivity type; an active layer stacked on said lower cladding layer;
   a first upper cladding layer of a second conductivity type different from said first conductivity type which is stacked on the active layer;
   a second upper cladding layer of said second conductivity type which has a ridge shape and is provided on said first upper cladding layer;
   current blocking layers provided on said first upper cladding layer alongside said second upper cladding layer and having a single layer structure which changes conductivity type only in a lateral direction such that respective sections that follow and cover substantially the entire sides of said second upper cladding layer are of said second conductivity type, and respective sections that follow said first upper cladding layer are of said first conductivity type; and
   a contact layer of said second conductivity type provided on said second upper cladding layer and on said current blocking layers alongside said second upper cladding layer.

2. The ridge-type semiconductor laser devise according to claim 1, wherein the injection current width, which is the width of the lower face of said second upper cladding layer, is equal to or less than the carrier dispersion length in said active layer.

3. The ridge-type semiconductor laser devise according to claim 1, wherein said current blocking layers confine a width of a current injected into said active layer substantially to a width of a bottom surface of said second upper cladding layer.

4. The ridge-type semiconductor laser devise according to claim 1, wherein said contact layer is provided directly on said second upper cladding layer without any intervening layer.

5. A ridge-type semiconductor laser devise, comprising:
   a lower cladding layer of a first conductivity type formed on a compound semiconductor substrate of said first conductivity type;
   an active layer having a width substantially the same as said semiconductor substrate, stacked on said lower cladding layer;
   a first upper cladding layer of a second conductivity type different from said first conductivity type which is stacked on the active layer;
   a second upper cladding layer of said second conductivity type which has a ridge shape and is provided on said first upper cladding layer;
   a contact layer of said second conductivity type provided on said second upper cladding layer; and
   current blocking layers provided on said first upper cladding layer alongside said second upper cladding layer and in which respective sections that follow and cover substantially the entire sides of said second upper cladding layer are of said second conductivity type, and respective sections that follow said first upper cladding layer are of said first conductivity type.

6. The ridge-type semiconductor laser devise according to claim 5, wherein said current blocking layers confine a width of a current injected into said active layer substantially to a width of a bottom surface of said second upper cladding layer.

7. The ridge-type semiconductor laser devise according to claim 5, wherein said contact layer is provided directly on said second upper cladding layer without any intervening layer.

* * * * *